United States Patent
Park et al.

(10) Patent No.: US 6,621,363 B2
(45) Date of Patent: Sep. 16, 2003

(54) DIFFERENTIAL TYPE VOLTAGE CONTROLLED OSCILLATOR

(75) Inventors: Sun-Hee Park, Yongin (KR); Sung-Chul Hong, Daejeon (KR); Yong-Gyo Seo, Yongin (KR); Ui-Sik Yoon, Daejeon (KR); Sang-Min Nam, Anyang (KR); Sang-Yoon Jeon, Seoul (KR); Sang-Woong Yoon, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/098,367

(22) Filed: Mar. 18, 2002

(65) Prior Publication Data

US 2003/0095458 A1 May 22, 2003

(30) Foreign Application Priority Data

Nov. 20, 2001 (KR) .......................... 2001-72471

(51) Int. Cl.$^7$ ................................. H03B 5/12
(52) U.S. Cl. ................ 331/117 fe; 331/117 R; 331/34; 331/177
(58) Field of Search ..................... 365/207; 331/117 R, 331/117 FE, 177, 179, 34, 36, 46

(56) References Cited

U.S. PATENT DOCUMENTS

| | | | | |
|---|---|---|---|---|
| 5,818,306 A | * | 10/1998 | Lee et al. | 331/117 FE |
| 6,016,082 A | * | 1/2000 | Cruz et al. | 331/117 FE |
| 6,150,893 A | * | 11/2000 | Fattaruso | 331/117 R |
| 6,249,190 B1 | * | 6/2001 | Rozenblit et al. | 331/46 |
| 6,268,778 B1 | * | 7/2001 | Mucke et al. | 331/117 R |
| 6,469,585 B1 | * | 10/2002 | Dai et al. | 331/57 |
| 6,469,587 B2 | * | 10/2002 | Scoggins | 331/117 R |

* cited by examiner

*Primary Examiner*—Son T. Dinh
(74) *Attorney, Agent, or Firm*—Sughrue Mion, PLLC

(57) ABSTRACT

A differential type VCO (Voltage Controllable Oscillator) is disclosed. The VCO has a differential amplifier having a couple of transistors and a couple of LC tanks. At each LC tank, a transformer is connected to form a buffer. An oscillating signal is output through the buffer with no power consumption. Additionally, a capacitor is connected to the secondary coil of the transformer to form a bandpass filter, thereby attenuating a harmonic signal included in the oscillating signal.

2 Claims, 2 Drawing Sheets

DIFFERENTIAL TYPE VOLTAGE CONTROLLED OSCILLATOR

BACKGROUND OF THE INVENTION

1. Field of the Invention The present invention relates to a voltage controlled oscillator (VCO) using a differential amplifier, and more particularly to a VCO using LC oscillator and a differential oscillator. The present application is based on Korean Application No. 2001-72471, which is incorporated herein by reference.

2. Description of the Related Art

FIG. 1 is a circuit diagram of a conventional VCO. It utilizes a differential amplifier and an LC tank(oscillator).

Referring to FIG. 1, a differential amplifier includes a couple of MOSFETs 10 and 12 for embodying a negative resistance, and another MOSFET 36 for embodying a current source controlling the MOSFETs 10 and 12. An LC tank includes variable capacitors 26 and 28 and inductors 14 and 20 which are connected to a drain port of each MOSFET 10 and 12. A current source 36 is controlled by a voltage applied to an input node 38. Variable capacitors 26 and 28 are controlled by a control voltage of a control node 34.

From a view from the LC tank, there is formed an impedance of a negative resistance on the differential amplifier, and consequently an output signal is generated from nodes 30 and 32 each connected to the drain of each MOSFET 10 and 12. The output signal generated from the nodes 30 and 32 is output at output nodes 18 and 24 through buffers 40 and 42 which include transistors.

However, as above described, in the conventional differential VCO, the buffer must be provided to pass the launch signal from the LC tank to other circuits, which results in much greater power consumption. That is, as shown in FIG. 1, since buffers 40 and 42 include transistors which consume additional power in addition to that consumed in each MOSFET embodying a negative resistance, much power is consumed.

Generally, it is very important to reduce power consumption in RF systems which use an oscillator and there are various methods for reducing the power consumption in the differential amplifier corresponding to a core portion of the oscillator. However, even if the power consumption in the differential amplifier decreases, the overall decrease in power consumption is limited since buffers 40 and 42 consume power continuously.

SUMMARY OF THE INVENTION

It is an object of the present invention to overcome the above described problem of conventional methods and therefore to provide a VCO using an LC tank and a differential amplifier which reduces power consumption in a buffer portion.

To achieve the above objects of the invention, there is provided a differential type voltage controlled oscillator comprising:

a current source;

a differential amplifier having a couple of transistors amplifying a difference of input signals controlled by the current source;

a couple of LC tanks oscillating an output signal from the transistors so as to generate the input signals; and a couple of transformers utilizing an inductor of each LC tank as a primary coil and generating an oscillating output signal from a secondary coil thereof.

According to a preferred embodiment of the invention, there is also provided a capacitor connected in parallel or in series with the secondary coil of the transformer so as to remove a harmonic signal contained in the oscillating output signal.

The oscillating signal is output through the transformer (buffer) so that it does not consume additional power.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Hereinafter, the invention in accordance with preferred embodiments will be described with the attached drawings.

Figure 1:
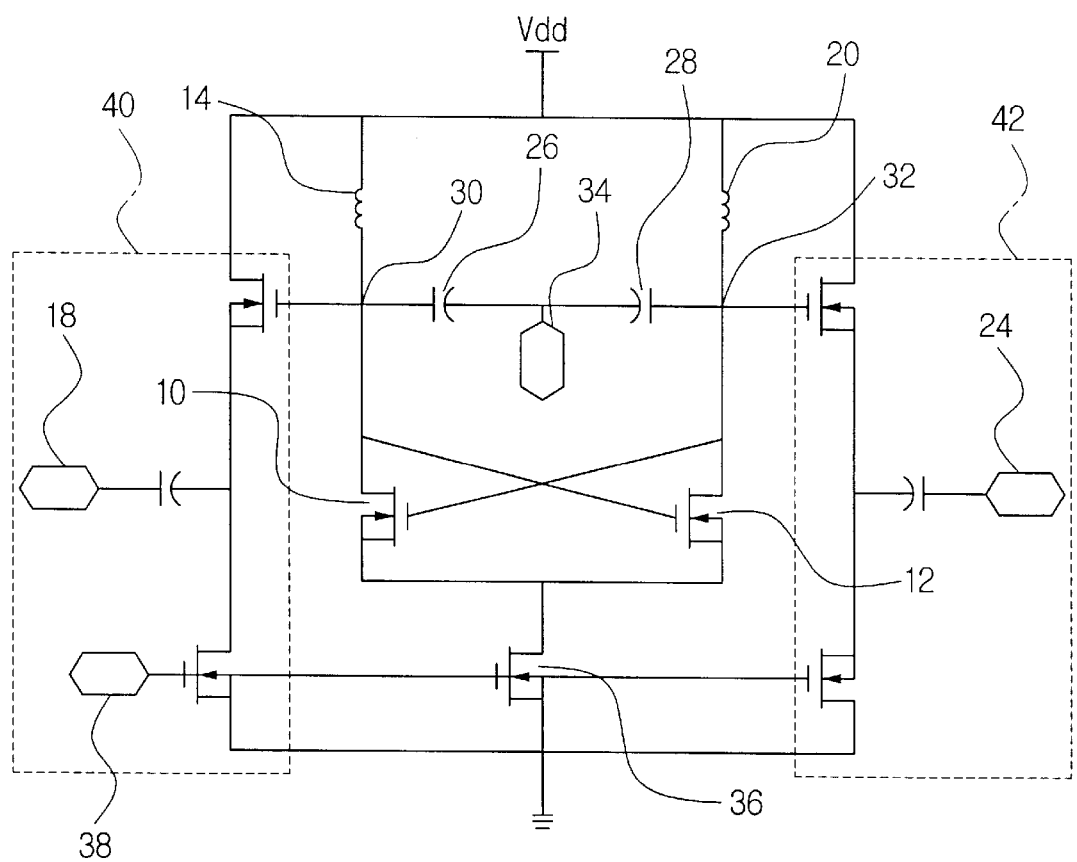
FIG. 1 is a circuit diagram of a conventional VCO using a differential amplifier.
Figure 2:
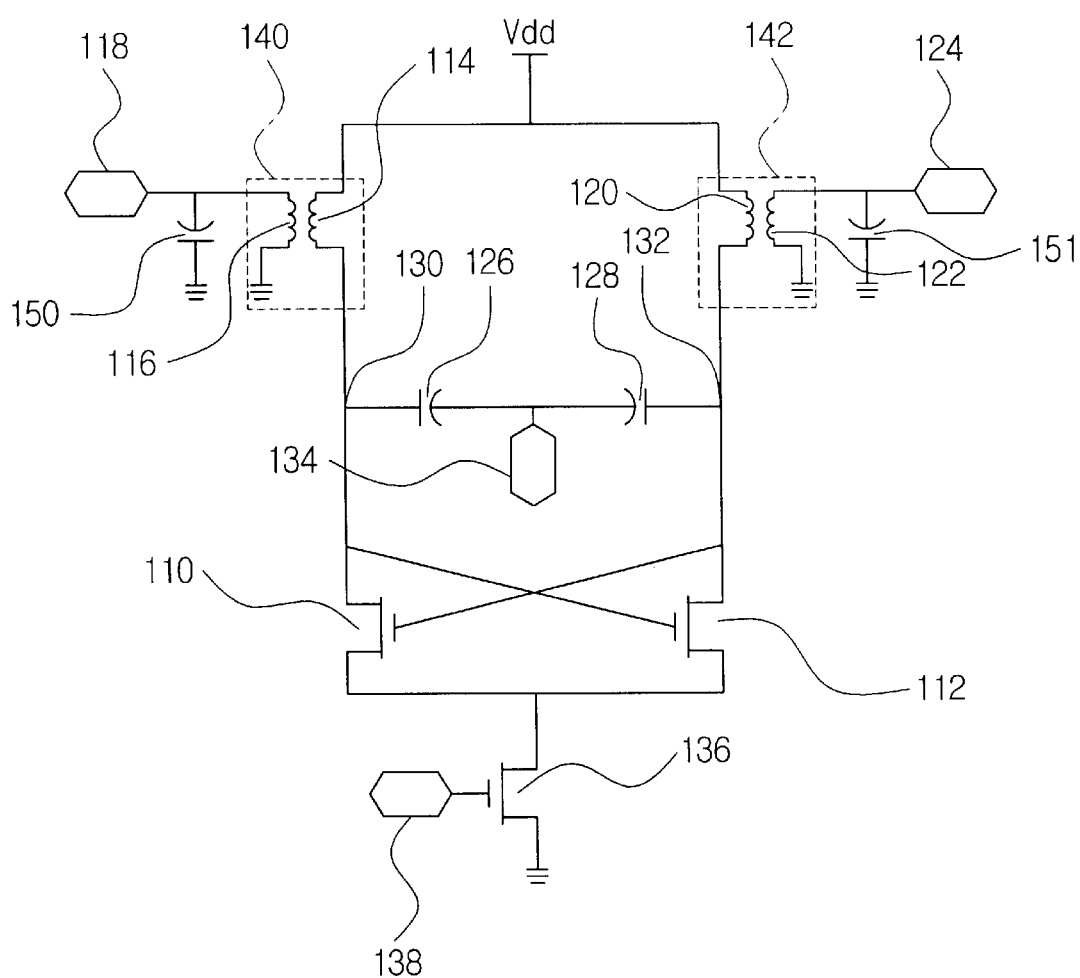
FIG. 2 is a circuit diagram of a VCO using an LC tank and a differential amplifier of the present invention.

FIG. 2 shows a VCO using an LC tank and a differential amplifier according to the present invention. As shown, the VCO includes a differential amplifier and a couple of oscillators.

The differential amplifier includes a couple of transistors 110 and 112, and another transistor 136 embodying a current source for controlling transistors 110 and 112. Each transistor 110 or 112 can be any type of transistor, and specifically in FIG. 2, there is used a field effect transistor (FET).

The current source 136 is disposed between the source of the transistors 110 and 112 and a ground terminal, and is controlled by a voltage applied to an input node 138.

Each drain of each transistor 110 or 112 is connected with the gate of each opposing transistor. Accordingly, the output signal from each drain is used as an input signal to the gate of the opposing transistor.

Each oscillator includes a variable capacitor 126 or 128 connected respectively to a drain of each transistor 110 or 112, and an inductor 114 or 120. The LC tanks oscillate signals output from the drains of transistors 110 and 112. The oscillated signal is input to a gate of each transistor 110 or 112 through mid-nodes 130 and 132. Accordingly, there can arise a launch signal at the mid-nodes 130 and 132 since the output signal from the LC tank is fed into the differential amplifier.

The variable capacitors 126 and 128 are controlled by a voltage applied to a control node 134 so as to control a resonance frequency.

Meanwhile, the VCO of the invention includes a couple of transformers 140 and 142 coupled with each LC tank. Each transformer 140 or 142 includes a primary coil 114 or 120 and a secondary coil 116 or 122 for transforming the voltage of the primary coil. As an important aspect of the invention, each primary coil 114 or 120 utilizes each inductor 114 or 120 of each LC tank. Accordingly, the oscillating signal within the LC tank is voltage-transformed by the transformers 140 and 142, and sequentially is output through the secondary coils 116 and 122.

The transformers 140 and 142 function as buffers blocking an interaction between the VCO and the external circuit when the oscillating signal is transferred outside of the VCO. That is, in the invention, instead of the transistor as a buffer in the conventional VCO, the transformers 140 and 142 are utilized as a buffer. Therefore there is no need to consume additional power in the buffer so that the overall power consumption decreases. The invention is much more useful when used in an RF system which requires a low power consumption.

Meanwhile, capacitors 150 and 151 are provide in series or in parallel with the secondary coils 116 and 122 of the transformers 140 and 142. The capacitors 150 and 151 make a band pass filter together with the secondary coils 116 and 122 so as to attenuate a second order harmonic signal from the oscillating signal through the secondary coils 116 and 122.

According to the present invention, the oscillating signal is output through the transformer (buffer) so that it does not consume additional power.

While the present invention has been particularly shown and described with reference to the preferred embodiment thereof, it will be understood by those skilled in the art that various changes in form and details may be made without departing from the spirit and scope of the invention as defined by the appended claims.

What is claimed is:

1. A differential type voltage controlled oscillator comprising:

a current source;

a differential amplifier having a couple of transistors amplifying a difference of input signals controlled by the current source;

a couple of LC tanks oscillating respective output signals from the transistors so as to generate the input signals; and a couple of transformers each utilizing an inductor of each LC tank as a primary coil and generating an oscillating output signal from a secondary coil thereof.

2. The differential type voltage controlled oscillator of claim 1, further comprising a capacitor connected in parallel or in series with the secondary coil of the transformer so as to remove a harmonic signal contained in the oscillating output signal.

* * * * *